(12) United States Patent
Chien et al.

(10) Patent No.: US 6,468,919 B2
(45) Date of Patent: Oct. 22, 2002

(54) METHOD OF MAKING A LOCAL INTERCONNECT IN AN EMBEDDED MEMORY

(75) Inventors: Sun-Chieh Chien, Hsin-Chu (TW); Chien-Li Kuo, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 14 days.

(21) Appl. No.: 09/764,326

(22) Filed: Jan. 19, 2001

(65) Prior Publication Data

US 2002/0098694 A1 Jul. 25, 2002

(51) Int. Cl.$^7$ ............................................... H01L 21/00
(52) U.S. Cl. ........................ 438/719; 438/735; 438/745
(58) Field of Search ................................. 438/629, 636, 438/672, 719, 720, 723, 724, 735–737, 742, 743, 744, 745, 753, 755, 756, 757, 721; 216/67, 79, 99

(56) References Cited

U.S. PATENT DOCUMENTS 6,008,141 A * 12/1999 Ibara et al. ................. 438/754
6,194,320 B1 * 2/2001 Oi ............................ 438/724 X
6,255,224 B1 * 7/2001 Kim .......................... 438/723

* cited by examiner

Primary Examiner—William A. Powell
(74) Attorney, Agent, or Firm—Winston Hsu

(57) ABSTRACT

The present invention provides a method to make a local interconnect in an embedded memory. The method first involves defining both a memory array area and a periphery circuit area on the surface of a semiconductor wafer. Then, a plurality of gates and lightly doped drains (LDD) are separately formed in the memory array area and in the periphery circuit area. A silicon nitride layer and a dielectric layer are then formed, respectively, on the surface of the semiconductor wafer and on each gate. Next, a plurality of landing via holes and local interconnect holes are separately formed in the dielectric layer in the memory array area and in the periphery circuit area, followed by the filling of an electrical conducting layer in each hole to simultaneously form a landing via and local interconnect. Then, the dielectric layer and a portion of the silicon nitride layer in the periphery circuit area are removed to form a spacer on either side of each gate in the periphery circuit area. Finally, a silicide layer is formed on the top surface of the landing via in the memory array area, as well as on the surfaces of each gate and on the surface of the local interconnect in the periphery circuit area.

18 Claims, 11 Drawing Sheets

METHOD OF MAKING A LOCAL INTERCONNECT IN AN EMBEDDED MEMORY

BACKGROUND OF THE INVENTION

1. Field of the Invention

The present invention provides a method of making a local interconnect in an embedded memory, more particularly, a method to decrease the resistance of the local interconnect in the embedded memory.

2. Description of the Prior Art

In the semiconductor industry, the increase in process integrity has led to the formation of an embedded memory by linking a memory array to a logic circuit. More specifically, both the memory cell array and the high-speed logic circuit elements are integrated onto the same chip to produce an embedded memory. An isolation layer is formed between every device and the circuit to avoid shorting the circuit, followed by the formation of a plurality contact holes in the isolation layer via a photo-etching-process (PEP). Finally, a conducting layer is filled into the contact hole to produce an electrical interconnection. between each metal-oxide-semiconductor (MOS) transistor and the circuit.

Please refer to FIG. 1 to FIG. 8 of the schematic diagrams of a prior art method of making a landing via of an embedded memory in a semiconductor wafer 10. As shown in FIG. 1, both a memory array area 12 and a periphery circuit area 14 are defined on the surface of a silicon base 16 of the semiconductor wafer 10. The memory array area 12 comprises a cell-well 18, and the periphery circuit area 14 comprises an N-well 20 and at least one P-well 22. In the prior art, a plurality of gates 24,26,28 are simultaneously formed in both the memory array area 12 and in the periphery circuit area 14, with spacers 30 surrounding either side of the gates 24,26,28, and a lightly doped drain (LDD) 32 located adjacent to the gates 24,26,28. As well, a source 34 and a drain 36 are formed adjacent to both the gate 26 and gate 28.

As shown in FIG. 2, a dielectric layer 38 is formed on the surface of the semiconductor wafer 10 as a silicon dioxide layer. And as shown in FIG. 3, a PEP process is then performed to define several thin metal connection regions 40. Then, as shown in FIG. 4, a second PEP process is used to define the first, second and third contact windows, 44,42, 46, respectively, in the dielectric layer 38. The first contact window 44 is used to contact with the capacitor. The second contact window 42 is used to contact with the bit line, also known as the landing via. The third contact window 46 functions as a source or drain and connects with a strip contact in the periphery circuit area 14. The depths of the first, second, and the third contact windows 44,42,46 are all equal, and therefore all horizontally aligned.

As shown in FIG. 5, a PEP process is performed to form a fourth contact window 48 in the dielectric layer 38. The fourth contact window 48 is located in the strip contact of the periphery circuit area 14 and is used to connect with the gate region. Since the fourth contact window 48 has a shallower depth than the three other contact windows 44,42, 46, it is not horizontally aligned with the contact windows 44,42,46. The third contact window 46 and the fourth contact window 48 separately connect with the gate, source, and drain regions of different transistors, and are therefore on different vertical planes. Next, as shown in FIG. 6, a barrier layer 50 and a dielectric layer 52 are formed, respectively, on the silicon base 16. The barrier layer 50 and the dielectric layer 52 may be composed of titanium nitride and tantalum oxide, respectively.

As shown in FIG. 7, a photoresist layer (not shown) is used as a mask to etch the dielectric layer 52 so that the dielectric layer 52 only exists in the area of the second contact window 42 and the metal contact area 40 of the memory array area 12. As shown in FIG. 8, a metal layer 54 is then deposited on the surface of the silicon base 16, to fill in the contact windows 42,44,46,48 and the metal contact areas 40. Finally, the dielectric layer 38 is used as a stop layer to produce a uniform metal layer 54.

In the above method of making the local interconnect of the embedded memory, the difference in depth between the memory array area and the periphery circuit area, requires the separate creation of the landing via and local interconnect. Thus, at least four photomasks are needed in the process, which is both complicated and costly. Also, a conducting layer is filled in between each landing via and local interconnect as conducting material, increasing the contact resistance while decreasing the electrical conductance.

SUMMARY OF THE INVENTION

It is therefore a primary objective of the present invention to provide a method to create a local interconnect in an embedded memory that simplifies the complexity of process, decreases cost, and effectively decreases resistance.

The method of the present invention first defines a memory array area and a periphery circuit area on the surface of a semiconductor wafer. Then, a plurality of gates and lightly doped drains (LDD) are separately formed in the memory array area and in the periphery circuit area. Next, a silicon nitride layer and a dielectric layer are formed, respectively, on the semiconductor wafer and on the surface of each gate. A plurality of landing via holes and local interconnect holes are then separately formed in the dielectric layer in the memory array area and the periphery circuit area. Next, an electrical conducting layer is filled into each hole to form the landing via and the local interconnect. Both the dielectric layer and a portion of the silicon nitride layer in the periphery circuit area are removed to form a spacer one either side of the gate in the periphery circuit area. Finally, a metal silicide layer is formed on the surfaces of the gates and the local interconnect in the periphery circuit area as well as on the top surface of the landing via in the memory array area.

Since the method of the present invention simultaneously forms each landing via and local interconnect, only a single photo mask is required in the entire process. As well, the formation of a silicide layer on the top surface of each landing via and on the surface of each local interconnect in the periphery circuit area decreases the resistance and improves the electrical performance of the embedded memory.

DETAILED DESCRIPTION OF THE PREFERRED EMBODIMENT

Figure 1:
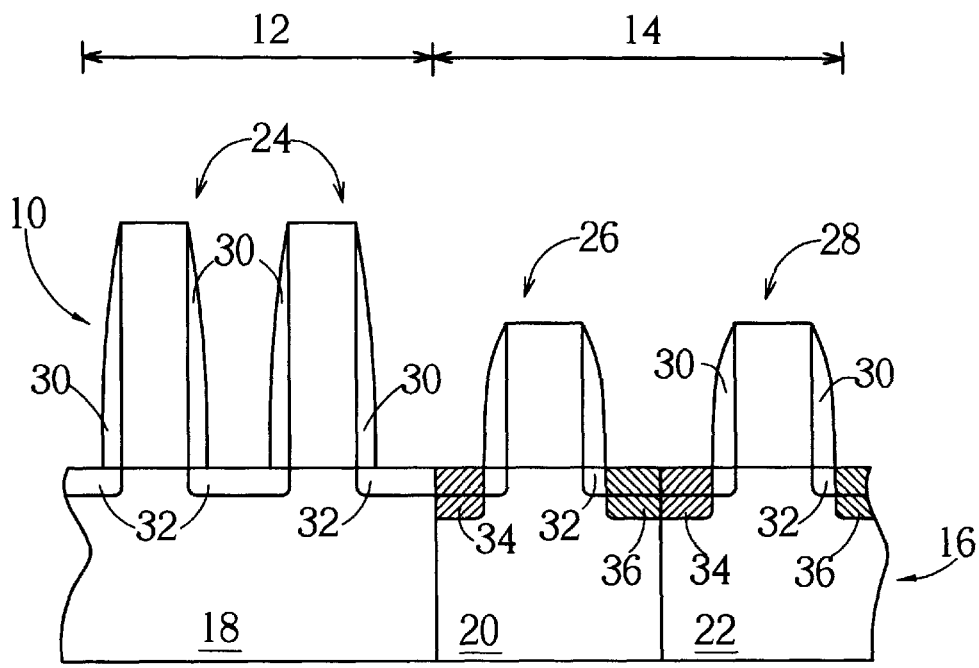
FIG. 1 to FIG. 8 are the schematic diagrams of the method of making a landing via and local interconnect in the embedded memory according to the prior art.
Figure 2:
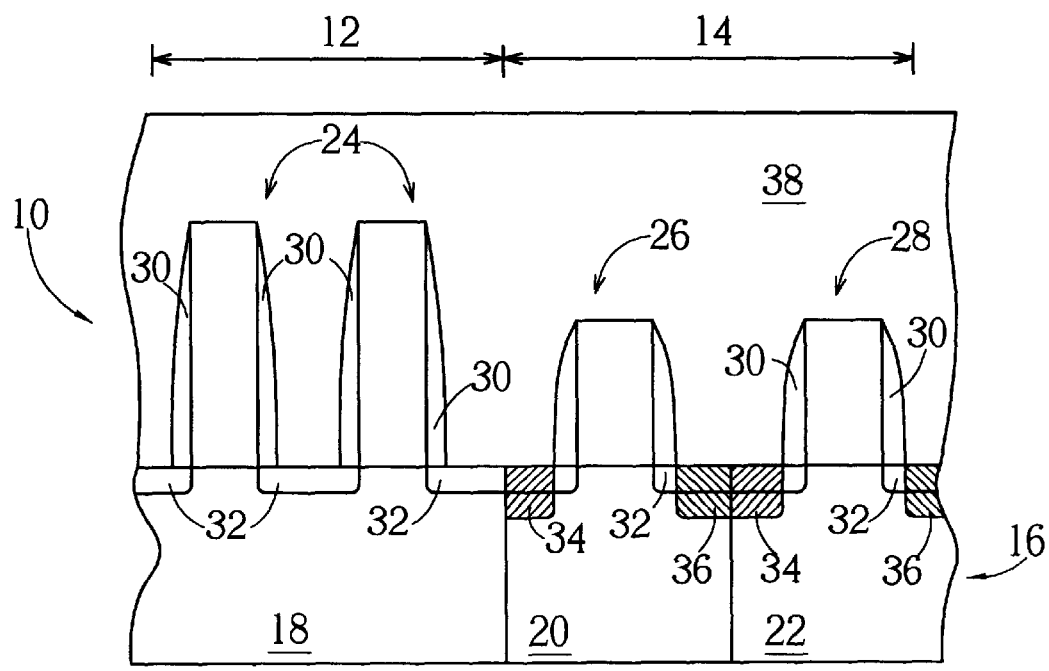
Figure 3:
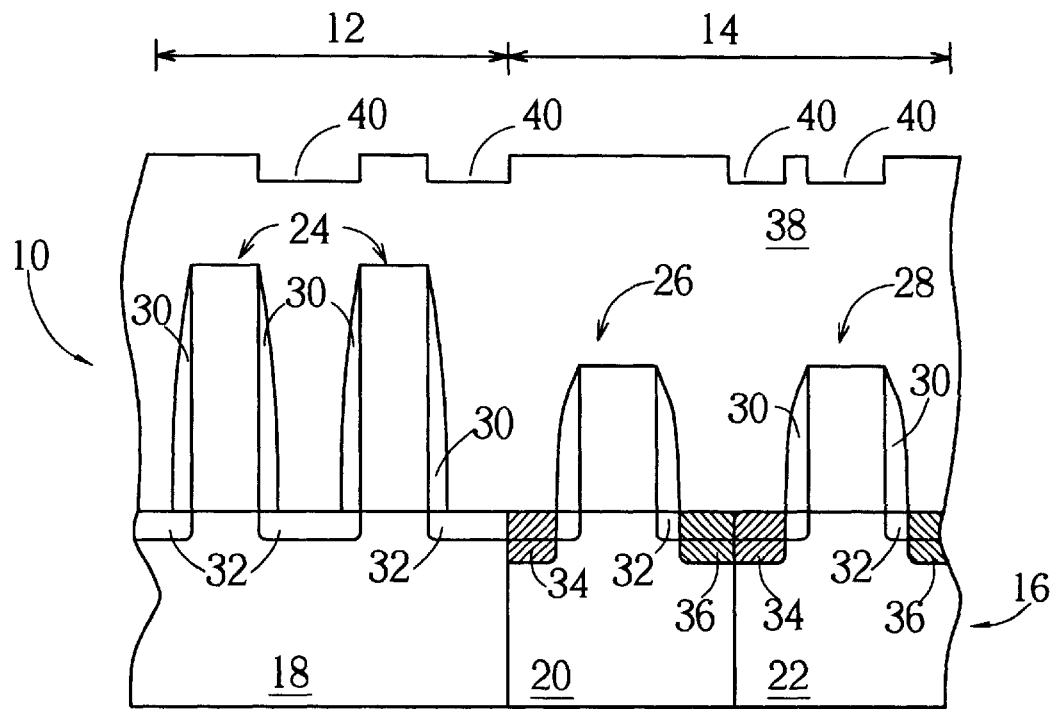
Figure 4:
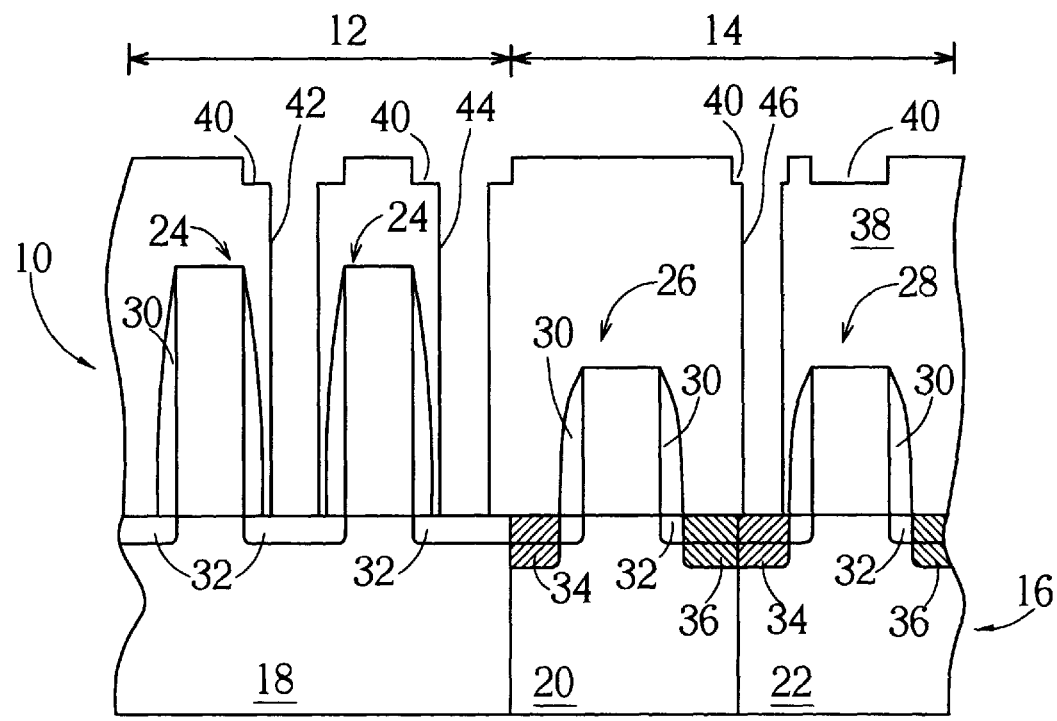
Figure 5:
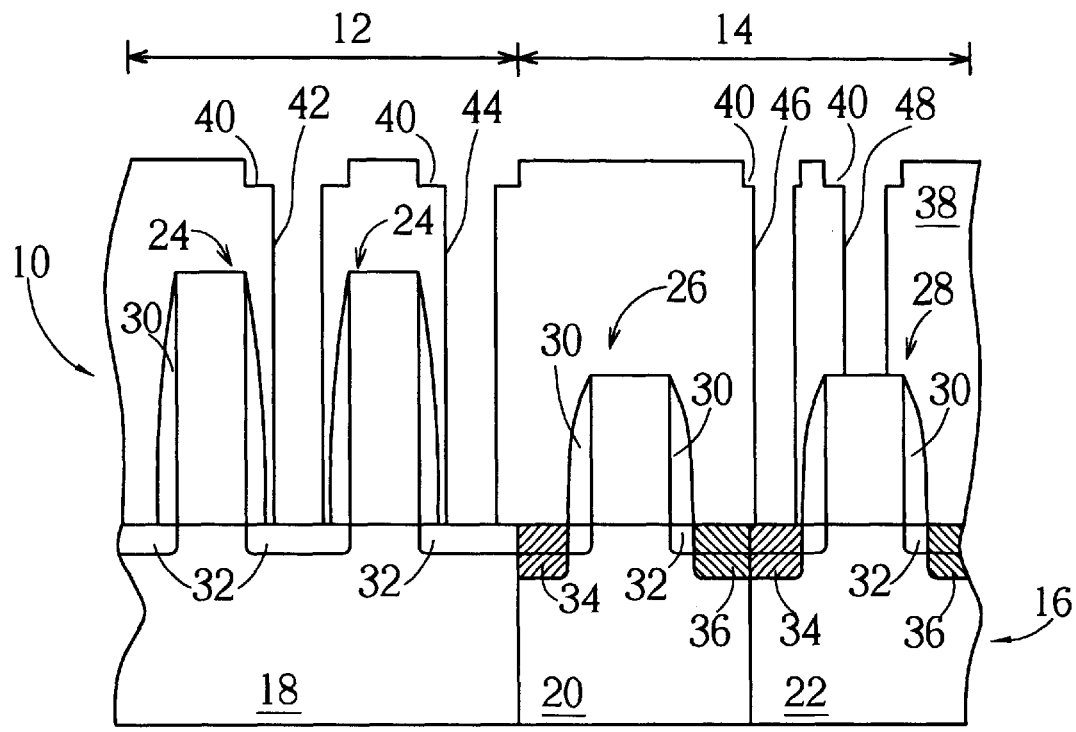
Figure 6:
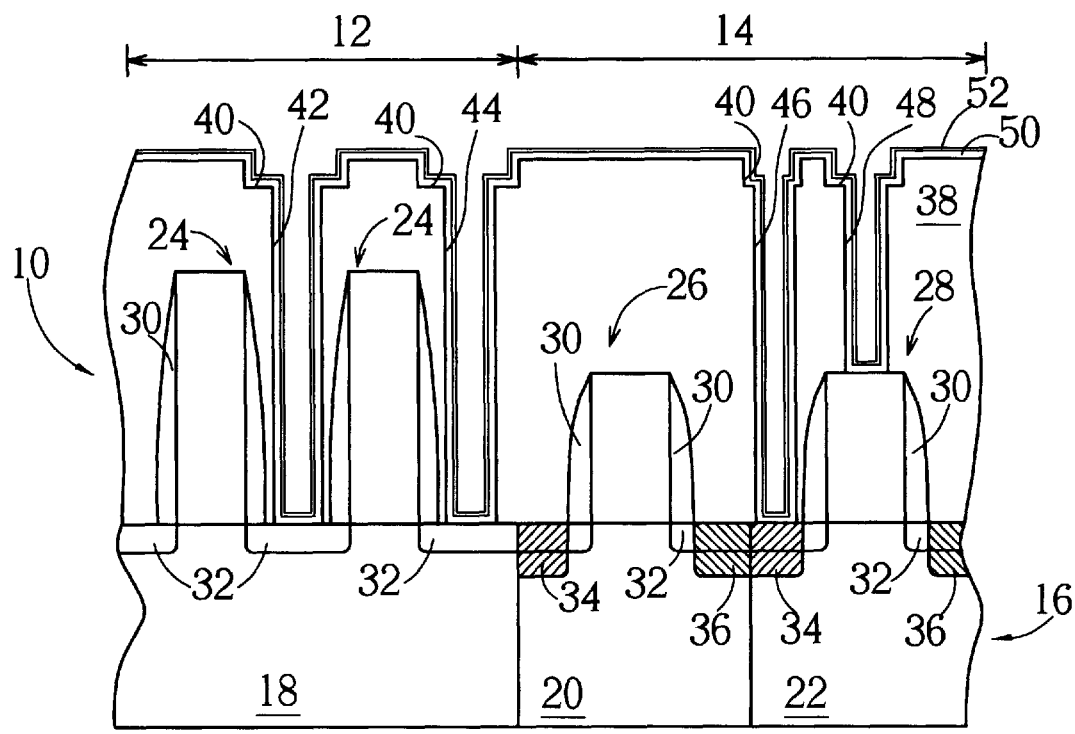
Figure 7:
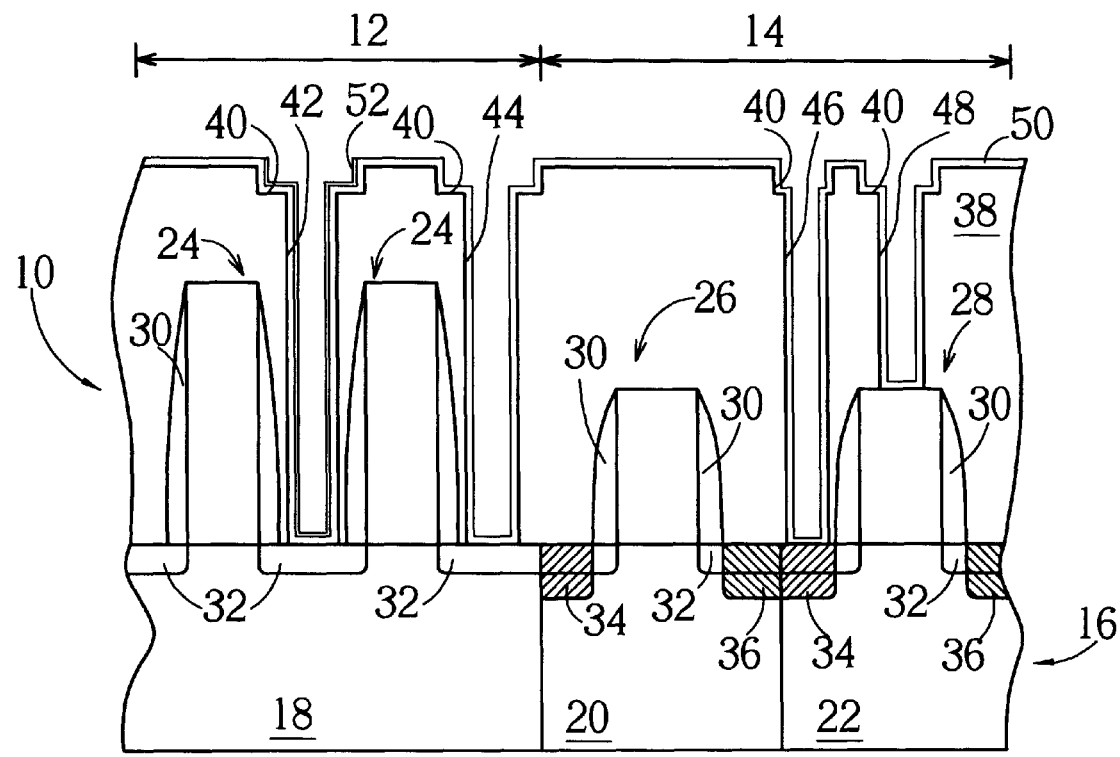
Figure 8:
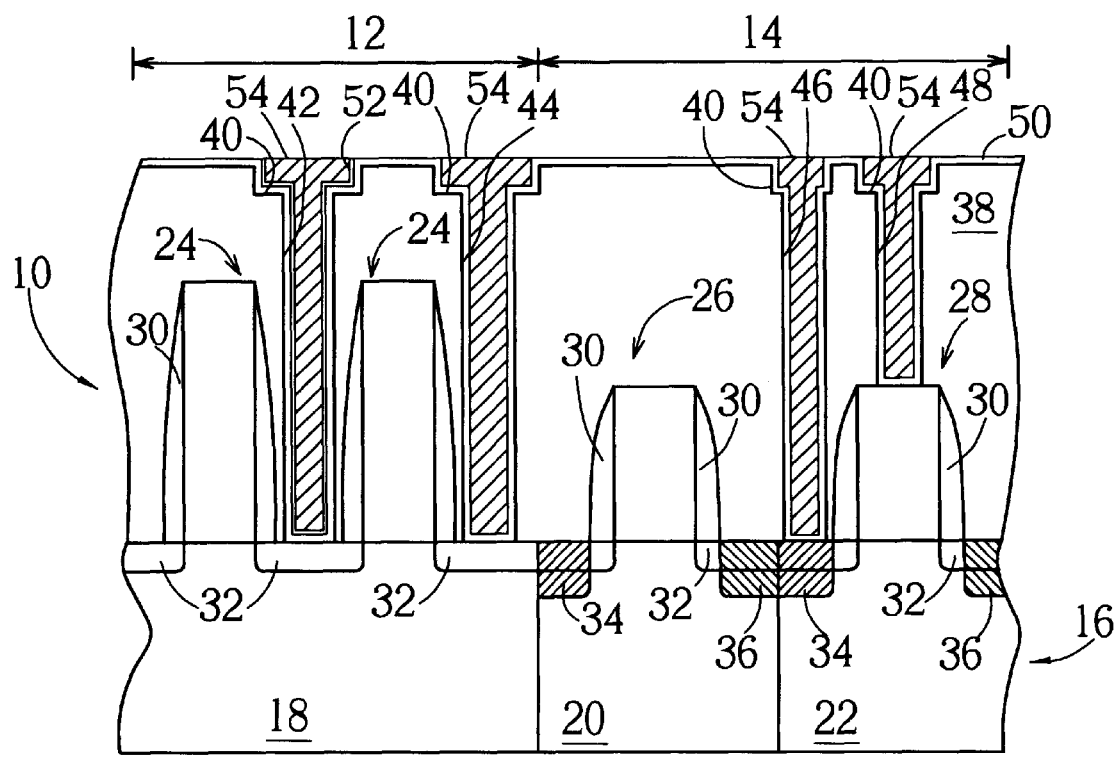
Figure 9:
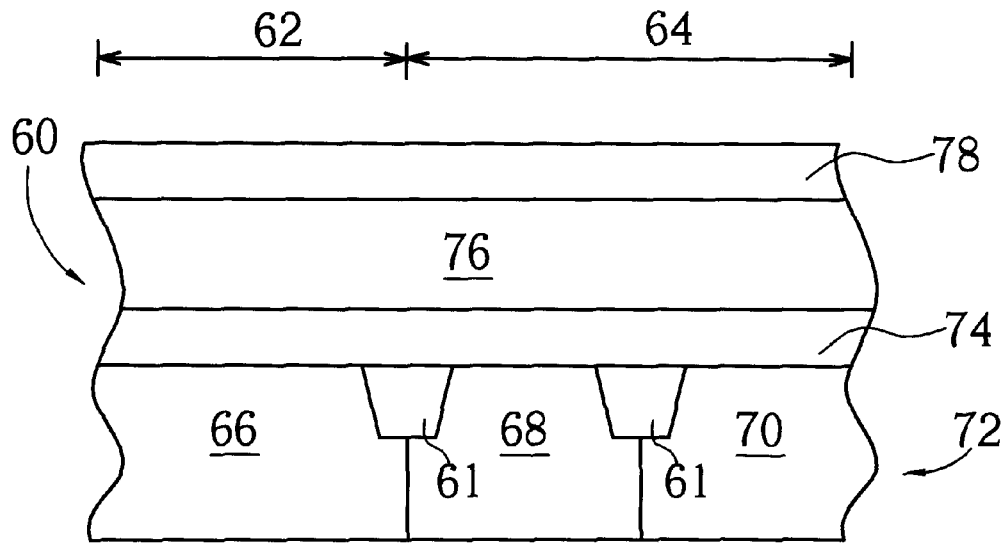
FIG. 9 to FIG. 21 are the schematic diagrams of the method used to make a landing via and local interconnect in the embedded memory according to the present invention.

Please refer to FIG. 9 to FIG. 21 of the schematic diagrams of the method used to simultaneously make a landing via and local interconnect in the embedded memory of the semiconductor wafer 60. As shown in FIG. 9, defined on the surface of the silicon base 72 in the semiconductor wafer 60 is a memory array area 62 and a periphery circuit area 64. The memory array area 62 comprises a single cell well 66, while the periphery circuit area 64 comprises an N-type well 68 and a P-type well 70. The cell well 66, N-type well 68 and P-type well 70 are seperated by shallow trenches 61.

Figure 10:
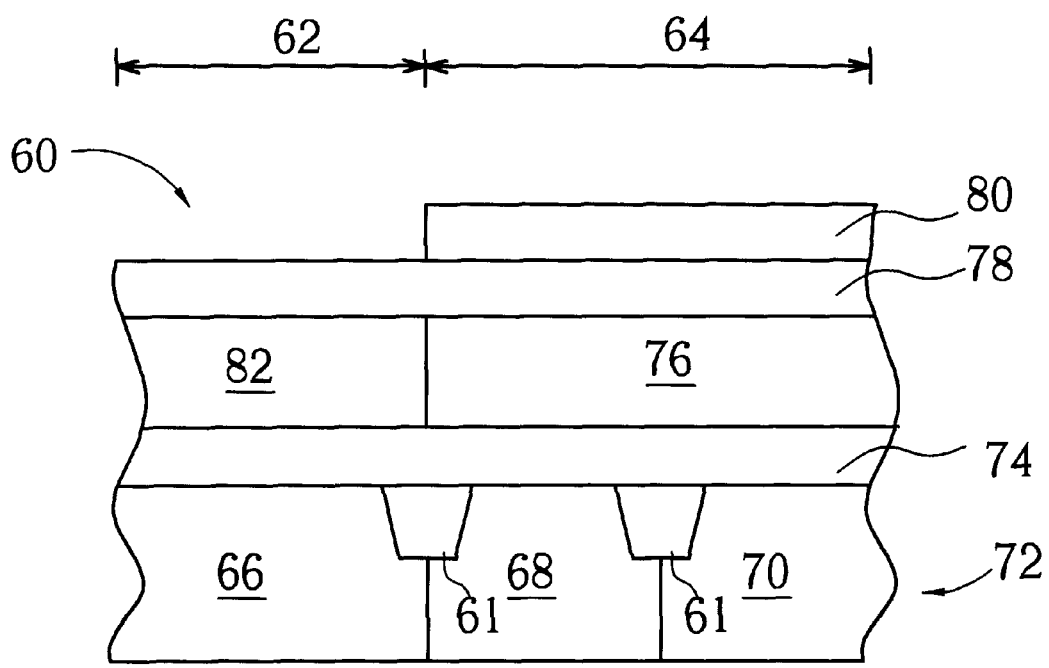

In the method of the present invention, a dielectric layer 74, an undoped polysilicon layer 76 and a dielectric layer 78 are first formed, respectively, on the surface of the semiconductor wafer 60. Then, as shown in FIG. 10, a mask layer 80 is formed on the dielectric layer 78 in the periphery circuit area 64. An N-type ion implantation process is then performed in the undoped polysilicon layer 76 in the memory array area 62 to form an N+ doped polysilicon layer 82.

Figure 11:
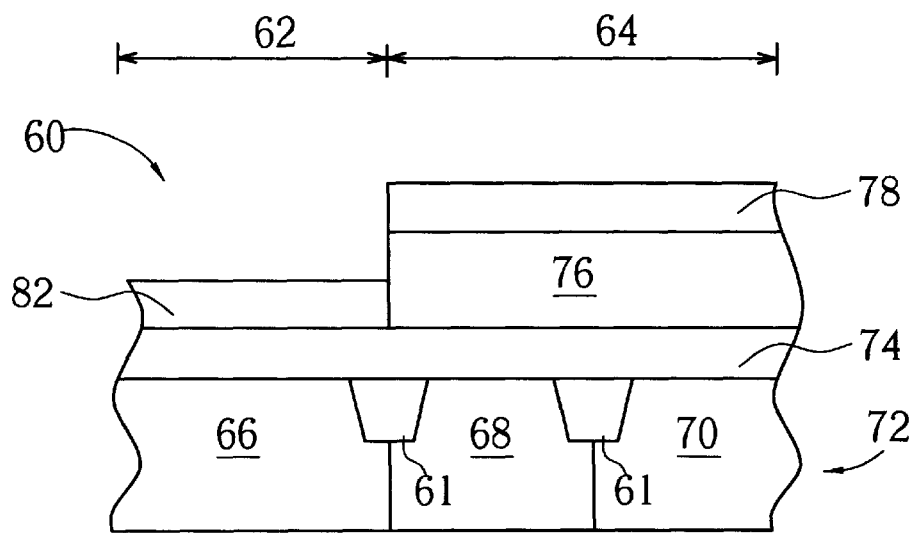

Next, as shown in FIG. 11, an etching process is performed to remove the portion of the dielectric layer 78 in the memory array area 62, as well as to etch the doped polysilicon layer 82 down to a thickness between 1000 to 1900 angstroms, i.e. approximately half of the total thickness of the undoped polysilicon layer 76.

Figure 12:
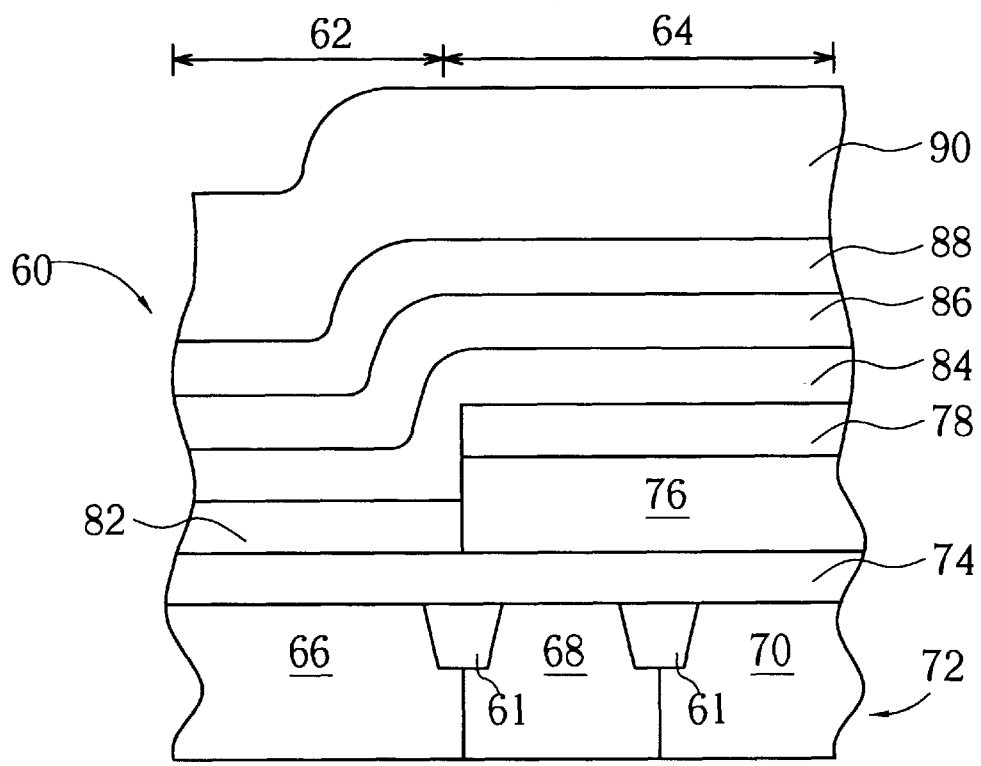

Following the removal of the mask layer 80, as shown in FIG. 12, a silicide layer 84 is then formed on the surface of the semiconductor wafer 60 to decrease the resistance of the contact interface of the doped polysilicon layer 82. Next, a silicon-oxy-nitride layer 86, functioning as an antireflective layer, a silicon nitride layer 88, functioning as a protective layer, and a photoresist layer 90 are formed, respectively, on the silicide layer 84.

Figure 13:
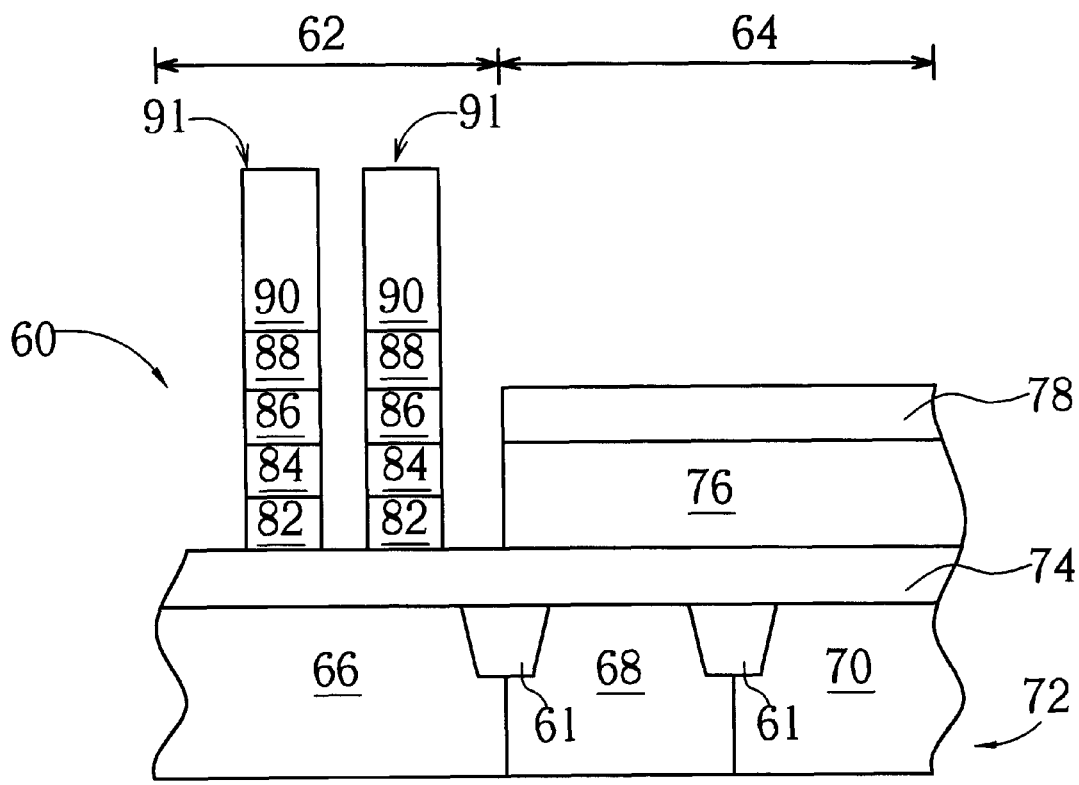

As shown in FIG. 13, the photoresist layer 90 is used as a hard mask to perform a PEP process to define the patterns of the plurality of gates 91 in the single cell well 66 in the memory array area 62. The PEP process etches the silicon nitride layer 88, the silicon-oxy-nitride layer 86, the silicide layer 84, and the doped polysilicon layer 82 down to the surface of the dielectric layer 74 to form the gates 91 of each MOS transistor in the memory array area 62. In the periphery circuit region 64, the silicon nitride layer 88, the silicon-oxy-nitride layer 86, and the metal silicide layer 84, are etched down to the surface of the dielectric layer 78 in situ.

Figure 14:
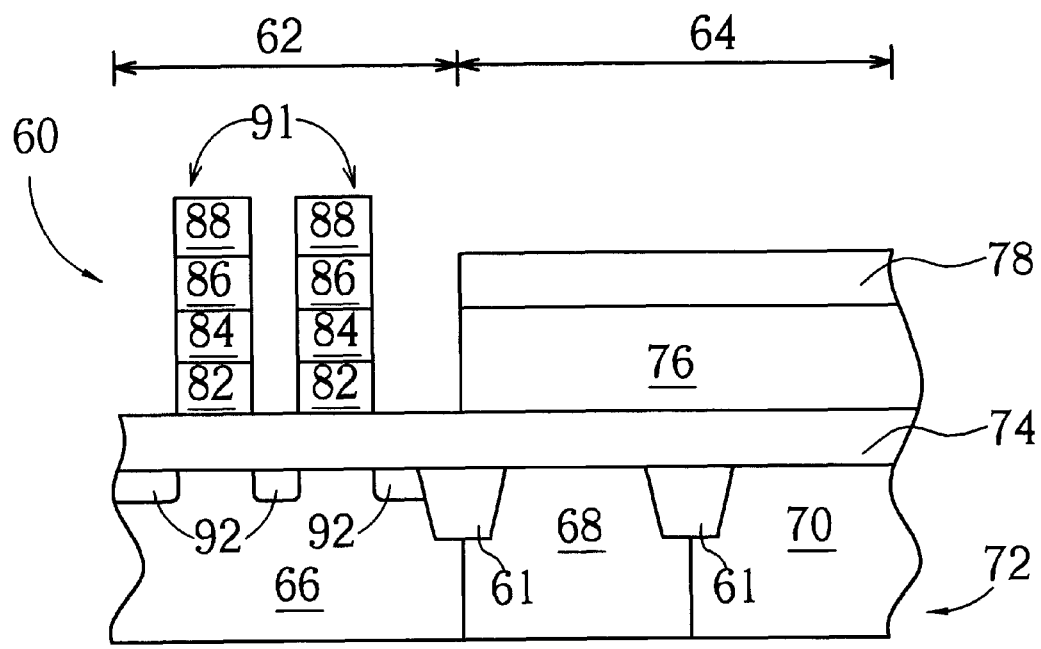
Figure 15:
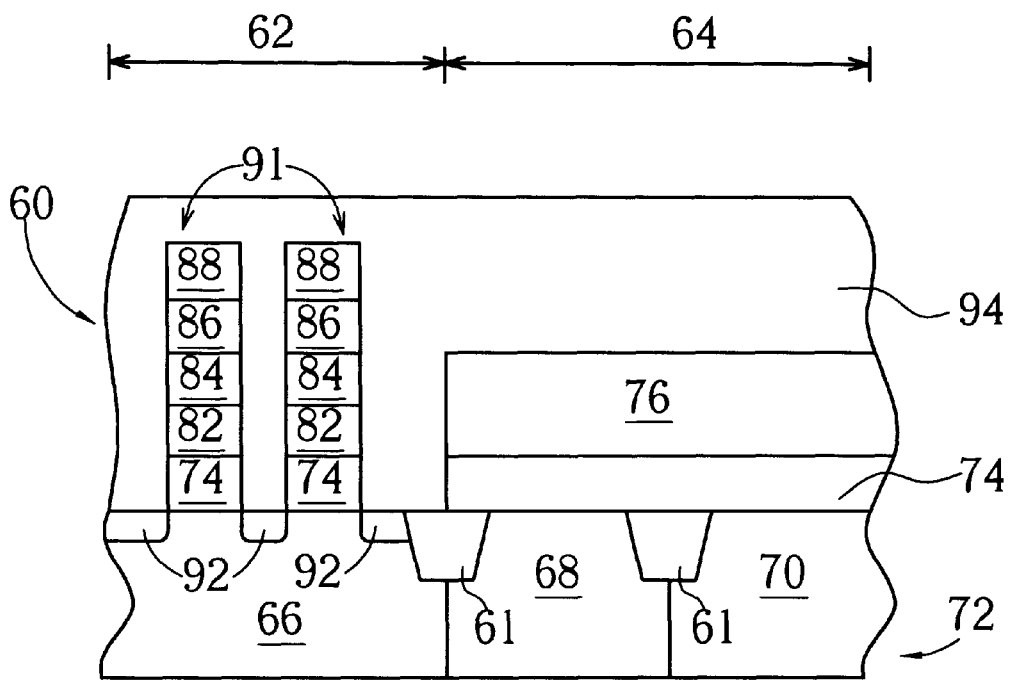
Figure 16:
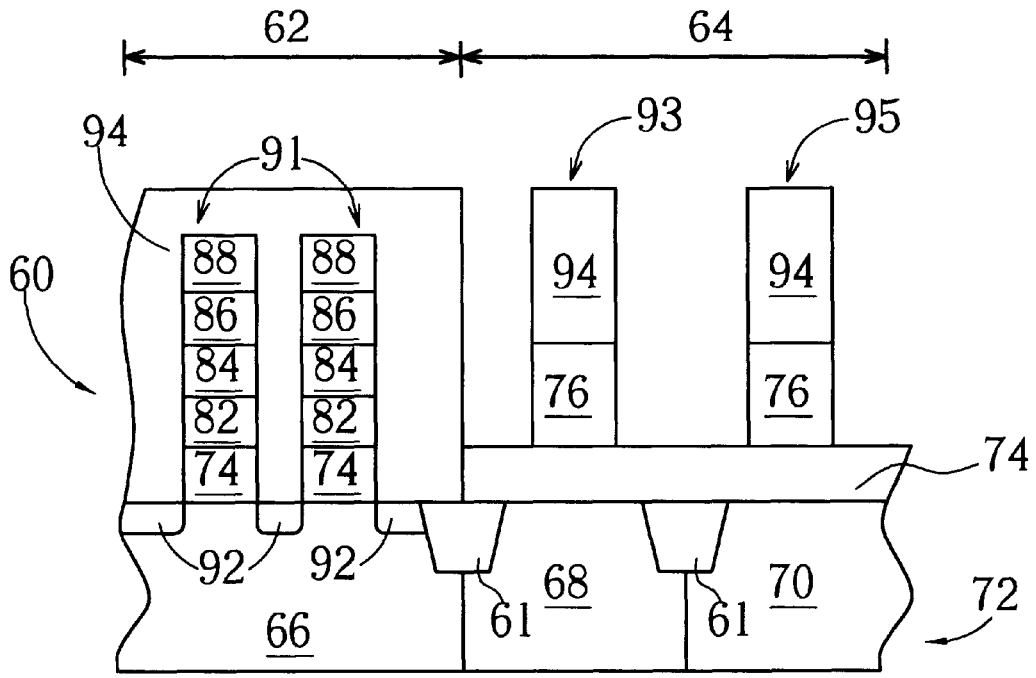

As shown in FIG. 14, an ion implantation process is performed to form lightly doped drains (LDD) in the memory array area 62, followed by the removal of the photoresist layer 90. Next, as shown in FIG. 15, the portion of the dielectric layer 74 outside the gates 91 in the memory array area 62 and the dielectric layer 78 in the periphery circuit area 64 are removed. A photoresist layer 94 and a silicon-oxy-nitride layer (not shown) are formed on the surface of the semiconductor wafer 60. The silicon-oxy-nitride layer functions as an anti-reflective layer. As shown in FIG. 16, a PEP process is performed to form multiple patterns of a gate on the photoresist layer 94 on both the N type well 68 and the P type well 70. Then, the pattern of the photoresist layer 94 is used as a hard mask to etch the undoped polysilicon layer 76 in the periphery circuit area 64 down to the surface of the dielectric layer 74, to form multiple gates 93,95 in the MOS transistor in the periphery circuit area 64.

Figure 17:
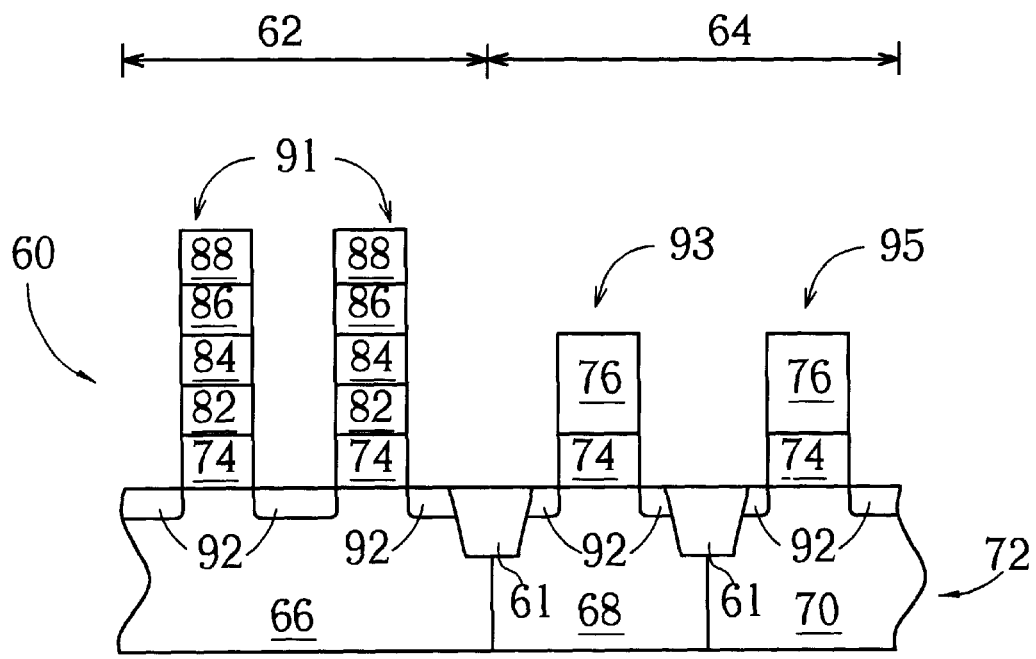
Figure 18:
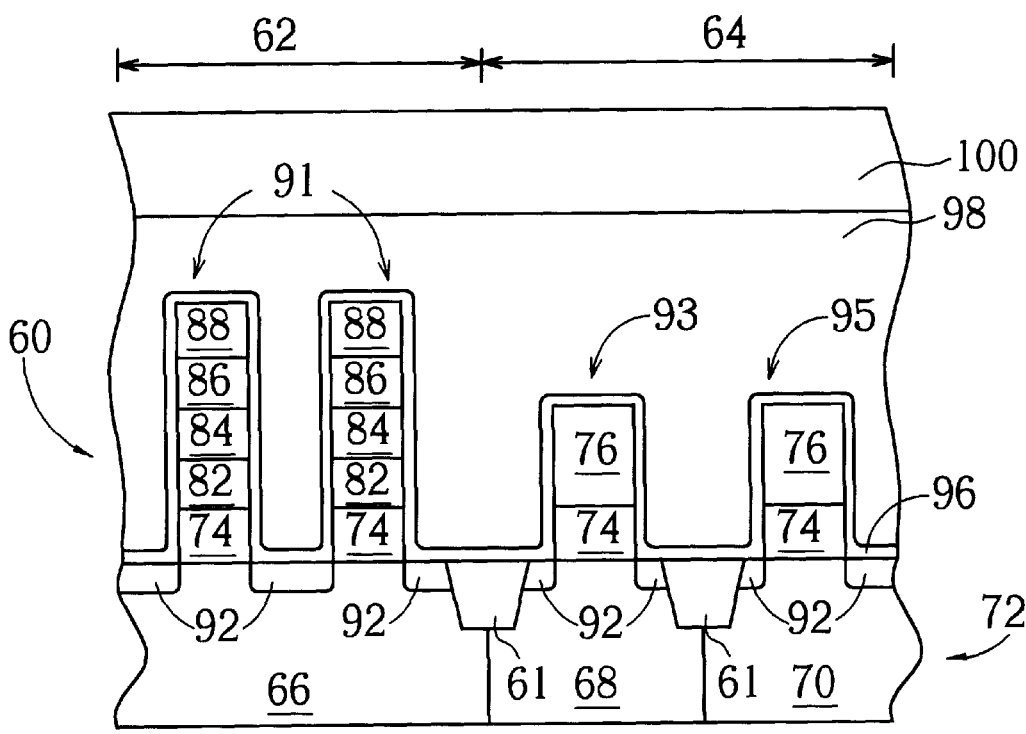

As shown in FIG. 17, lightly doped drains (LDD) 92 are formed in each MOS transistor in the periphery circuit area 64 via an ion implantation process. Following the removal of the photoresist layer 94, as shown in FIG. 18, a silicon nitride layer 96, a dielectric layer 98, and a photoresist layer 100 is formed on the surface of the semiconductor wafer 60 to cover the surfaces of the gates 91,93 and 95.

Figure 19:
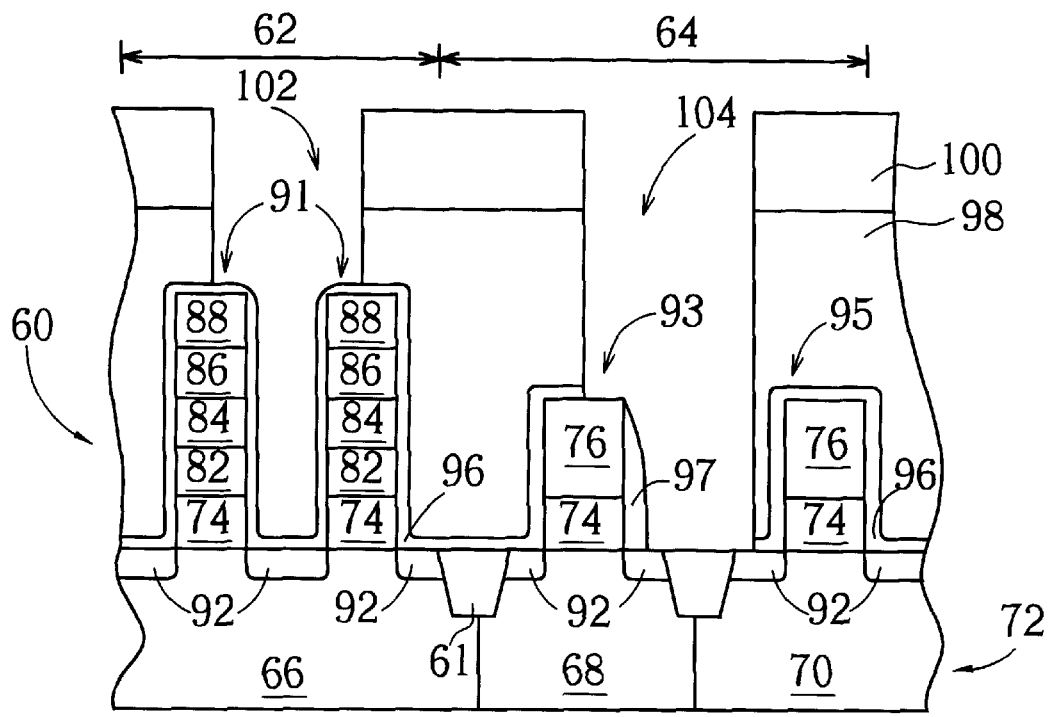

As shown in FIG. 19, a PEP is then used to define a plurality of landing vias and multiple patterns of a local interconnect in the photo resistor layer 100. The photoresist layer 100 functions as a hard mask to etch both the dielectric layer 98 and a portion of the silicon nitride layer 96. As a result, a plurality of landing via holes 102 are formed in the dielectric layer 98 in the memory array area 62, as well as a plurality of local interconnect holes 104 in the dielectric layer 98 in the periphery circuit area 64. A spacer 97 is then formed to connect with the local interconnect hole 104.

Figure 20:
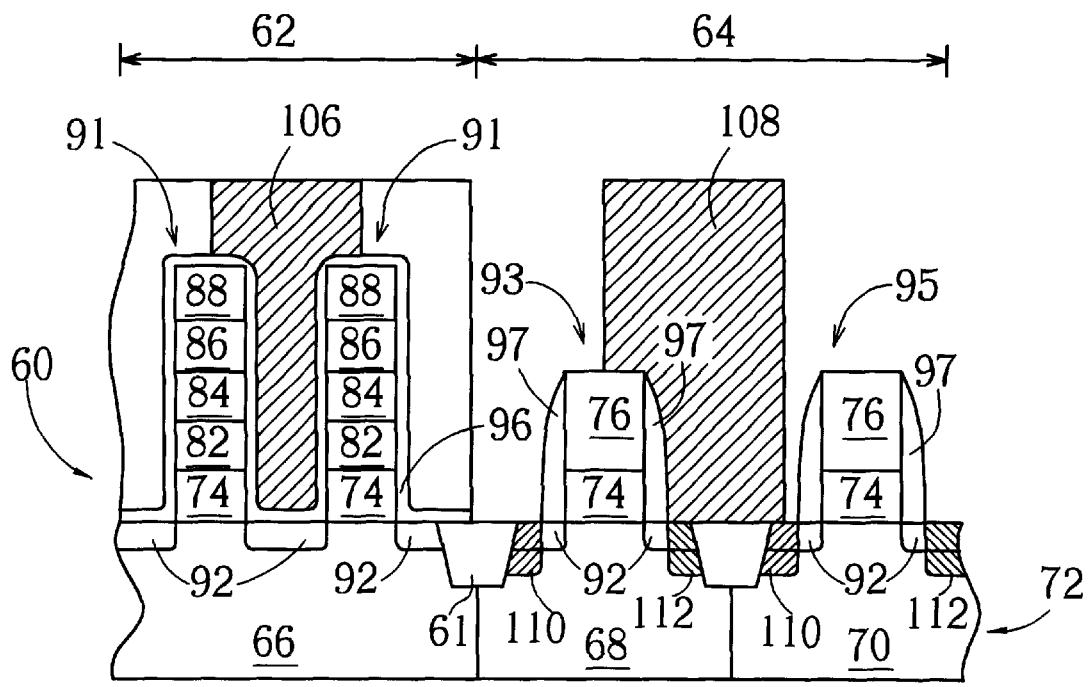

As shown in FIG. 20, each landing via 106 and local interconnect 108 are simultaneously formed by the filling of an electrical conducting layer in each landing via hole 102 and interconnect hole 104. The local interconnect 108 is a source or drain which connects the gate 93 with another gate, whereby the local interconnect 108 and the gate 93 are located on different and separate vertical planes. Then, the dielectric layer 98 in the periphery circuit area 64 and a portion of the silicon nitride layer 96 are removed by an etching process to form a spacer 97 on either side of the gates 93 and 95 in the periphery circuit area 64. Next, an ion implantation process is performed to form a source area 110 and a drain area 112 adjacent to the gates 93 and 95 in the periphery circuit area 64.

Figure 21:
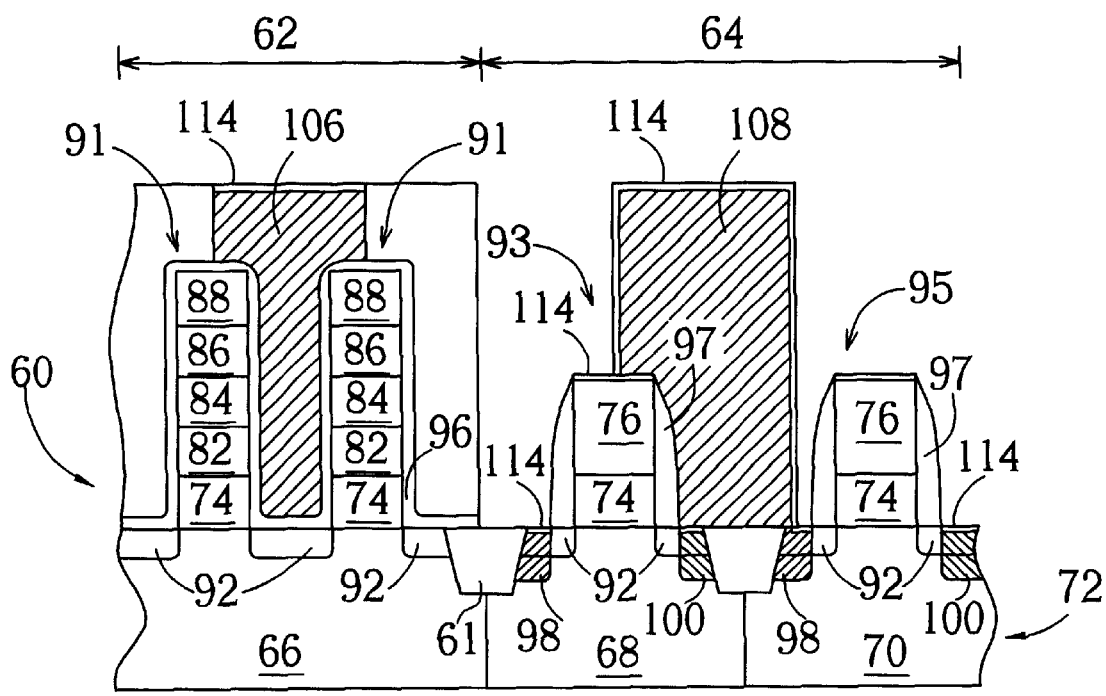

Finally, as shown in FIG. 21, a salicide process is performed to form a silicide layer 114 of cobalt(Co), titanium (Ti), nickel (Ni) or molybdenum(Mo) on the top surface of each landing via 106 in the memory array area 62, as well as on the surfaces of the local interconnect 108 and gates 93 and 95 in the periphery circuit area 64.

In comparison with the prior art method of producing a local interconnect in an embedded memory, the method of the present invention simultaneously forms the landing via in the memory array area and the local interconnect in the periphery circuit area. As a result, fewer masks are required to simplify the process. As well, a silicide layer is formed on the top surface of the landing via and on the surface of the local interconnect to decrease the resistance and improve the electrical performance of the embedded memory.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of making a local interconnect in an embedded memory, the method comprising:

providing a semiconductor wafer in which the surface of the silicon substrate has both a defined memory array area and a periphery circuit area;

separately forming a plurality of gates in both the memory array area and the periphery circuit area, and forming lightly doped drains (LDD) adjacent to each gate;

forming a silicon nitride layer, a first dielectric layer, and a first photoresist layer on the surface of the semiconductor wafer, respectively, as well as covering the surface of the gate;

performing a photo-etching-process (PEP) to define a plurality of landing vias and multiple patterns of the local interconnect in the first photoresist layer;

etching the first dielectric layer using the pattern of the first photoresist layer as a hard mask, to form a plurality of landing via holes in the first dielectric layer in the memory array area, as well as a plurality of local interconnect holes in the first dielectric layer in the periphery circuit area;

filling an electrical conducting layer in each landing via and local interconnect hole to form the landing vias and local interconnects;

removing the first dielectric layer and a portion of the silicon nitride layer in the periphery circuit area by performing a first etching process to form a spacer on either side of each gate in the periphery circuit area; and performing a salicide process to form a metal silicide layer on the top surface of the landing via in the memory array area and on the surface of each gate and on the local interconnect in the periphery circuit area.

2. The method of claim 1 wherein the method involves the formation of each gate in both the memory array area and in the periphery circuit area, and the formation of lightly doped drains (LDD), the method comprising:

forming a second dielectric layer, an undoped polysilicon layer, and a third dielectric layer on the surface of the semiconductor wafer, respectively;

performing a first ion implantation process in the undoped polysilicon layer in the memory array area to form a doped polysilicon layer in the undoped polysilicon layer in the memory array area;

performing a second photo etching process to remove the third dielectric layer in the memory array area and to etch the doped polysilicon layer to a predetermined thickness;

forming a silicide layer, a protective layer, and a second photoresist layer on the surface of the semiconductor wafer, respectively;

performing a second photo-etching-process to define a plurality of patterns of the gate in the second photoresist layer in the memory array area;

etching the protective layer, the silicide layer, the doped polysilicon layer, and the doped polysilicon layer in the memory array area down to the surface of the second dielectric layer using the pattern of the second photoresist layer as a hard mask, as well as to etch the protective layer and the metal silicide layer in the periphery circuit area down to the surface of the third dielectric layer;

performing a second ion implantation process to form lightly doped drains (LDD) adjacent to each gate in the memory array area;

removing the second photoresist layer and the third dielectric layer in the periphery circuit area;

performing a third photo-etching-process to define a plurality of patterns of the gate in a third photoresist layer in the periphery circuit area;

etching the undoped polysilicon layer in the periphery circuit area using the patterns of the third photoresist layer as a hard mask to form each gate in the periphery circuit area;

performing a third ion implantation process to form lightly doped drains (LDD) adjacent to each gate in the periphery circuit area; and removing the third photoresist layer.

3. The method of claim 2 wherein the second dielectric layer is composed of silicon dioxide ($SiO_2$), and functions as a gate oxidation layer of each gate.

4. The method of claim 2 wherein the thickness is about half the total thickness of the undoped polysilicon layer.

5. The method of claim 2 wherein the protective layer is composed of silicon nitride, and a silicon-oxy-nitride ($SiO_xN_y$, where $0<x<2$ and $0<y<4/3$) layer is formed between the protective layer and the silicide layer as an anti-reflection coating(ARC).

6. The method of claim 2 wherein a silicon-oxy-nitride ($SiO_xN_y$, where $0<x<2$ and $0<y<4/3$) layer is first formed on the surface of the semiconductor wafer as an anti-reflection coating (ARC) prior to the formation of the third photoresist layer on the surface of the semiconductor wafer.

7. The method of claim 6 wherein the silicon-oxy-nitride ($SiO_xN_y$, where $0<x<2$ and $0<y<4/3$) layer formed below the third photoresist layer is removed after the removal of the third photoresist layer.

8. The method of claim 1 wherein a fourth ion implantation process is performed after the formation of each spacer on either side of each gate in the periphery circuit area, to form a source and drain adjacent to each gate in the periphery circuit area.

9. The method of claim 1 wherein the silicide layer is composed of cobalt (Co), titanium (Ti), nickel (Ni), or molybdenum (Mo).

10. A method used to decrease the resistance of a local interconnect in an embedded memory, the method comprising:

providing a semiconductor wafer with both a defined memory array area and a periphery circuit area on the surface of the silicon base of the semiconductor wafer, with the memory array area comprising a single cell-well and the periphery circuit area comprising both an N-well and a P-well;

separately forming a plurality of gates in both the memory array area and in the periphery circuit area, as well as forming lightly doped drains (LDD) adjacent to each gate;

forming a silicon nitride layer, a first dielectric layer, and a first photoresist layer on the surface of the semiconductor wafer, as well as covering the surface of each gate;

performing a first photo-etching-process (PEP) to define a plurality of landing vias and multiple patterns of the local interconnect in the first photoresist layer;

etching the first dielectric layer using the patterns of the first photoresist layer as a hardmask, to form a plurality of landing via holes in the first dielectric layer in the memory array area, as well as a plurality of interconnect holes in the first dielectric layer in the periphery circuit area;

filling an electrical conducting layer in each local interconnect hole and in each landing via hole to form a landing via and a local interconnect;

removing the first dielectric layer and a portion of the silicon nitride layer in the periphery circuit area to form a spacer on either side of each gate in the periphery circuit area; and performing a salicide process to form a metal silicide layer on the top surface of each landing via in the memory array area, as well as on the surfaces of each local interconnect and each gate in the periphery circuit area to decrease the resistance of the local interconnect of the embedded memory.

11. The method of claim 10 wherein a gate is formed in the memory array area and in the periphery circuit area, as well as the formation of lightly doped drains (LDD) adjacent to each gate, the method comprises:

forming a second dielectric layer, an undoped polysilicon layer and a third dielectric layer on the surface of the semiconductor wafer, respectively;

performing a first ion implantation process on the undoped polysilicon layer in the memory array area to form a doped polysilicon layer in the undoped polysilicon layer;

performing a second etching process to completely remove the third dielectric layer in the memory array area and to etch the doped polysilicon layer to a thickness;

forming a silicide layer, a protective layer and a second photoresist layer on the surface of the semiconductor wafer, respectively;

performing a second photo-etching-process to define a plurality of patterns of the gates in the second photoresist layer above the single cell well of the memory array area;

etching the protective layer, the metal silicide layer, and the doped polysilicon layer in the memory array area down to the surface of the second dielectric layer using the pattern of the second photoresist layer as a hard mask, as well as etching the protective layer and the silicide layer in the periphery circuit area down to the surface of the third dielectric layer;

removing the second photoresist layer;

performing a second ion implantation process to form lightly doped drains (LDD) adjacent to each gate in the memory array area;

removing the third dielectric layer in the periphery circuit area;

forming a third photoresist layer on the surface of the semiconductor wafer;

performing a third photo-etching-process to define a plurality of patterns of the gates in the third photoresist layer in both the N type well and the P type well in the periphery circuit area;

etching the undoped polysilicon layer in the periphery circuit area using the patterns of the third photoresist layer as a hard mask, to form each gate in the periphery circuit area;

removing the third photoresist layer; and performing a third ion implantation process to form lightly doped drains (LDD) adjacent to each gate in the periphery circuit area.

12. The method of claim 11 wherein the second dielectric layer is composed of silicon dioxide($SiO_2$) and functions as an oxide layer of each gate.

13. The method of claim 11 wherein the thickness is about half of the total thickness of the undoped polysilicon layer.

14. The method of claim 11 wherein the protective layer is composed of a silicon nitride compound, and the silicon-oxy-nitride ($SiO_xN_y$, where $0<x<2$ and $0<y<4/3$) layer is formed between the protective layer and the silicide layer as an antireflection coating (ARC).

15. The method of claim 11 wherein the silicon-oxy-nitride ($SiO_xN_y$, where $0<x<2$ and $0<y<4/3$) layer is formed as an antireflection coating (ARC) prior to the formation of the third photoresist layer on the surface of the semiconductor wafer.

16. The method of claim 15 wherein the silicon-oxy-nitride ($SiO_xN_y$, where $0<x<2$ and $0<y<4/3$) layer beneath the third photoresist layer is removed after the removal of the third photoresist layer.

17. The method of claim 10 wherein after the formation of the spacer on either side of each gate in the periphery circuit area, the method comprises:

performing a fourth and fifth ion implantation process to separately form a source and a drain adjacent to each gate in both the P type well and the N type well in the periphery circuit area.

18. The method of claim 10 wherein the metal silicide layer is composed of cobalt (Co), titanium(Ti), nickel(Ni), or molybdenum(Mo).

* * * * *